(12) United States Patent
Holec

(10) Patent No.: US 10,811,799 B2
(45) Date of Patent: Oct. 20, 2020

(54) INTERCONNECTABLE CIRCUIT BOARDS ADAPTED FOR LATERAL IN-PLANE BENDING

(71) Applicant: Metrospec Technology, L.L.C., Mendota Heights, MN (US)

(72) Inventor: Henry V. Holec, Mendota Heights, MN (US)

(73) Assignee: Metrospec Technology, L.L.C., Mendota Heights, MN (US)

(*) Notice: Subject to any disclaimer, the term of this patent is extended or adjusted under 35 U.S.C. 154(b) by 0 days.

(21) Appl. No.: 16/269,204

(22) Filed: Feb. 6, 2019

(65) Prior Publication Data

US 2019/0252810 A1    Aug. 15, 2019

Related U.S. Application Data

(60) Provisional application No. 62/628,471, filed on Feb. 9, 2018.

(51) Int. Cl.
| | |
|---|---|
| *H01R 12/73* | (2011.01) |
| *H05K 1/02* | (2006.01) |
| *H01R 12/72* | (2011.01) |
| *H01R 13/52* | (2006.01) |

(52) U.S. Cl.
CPC ......... *H01R 12/73* (2013.01); *H01R 12/721* (2013.01); *H01R 13/52* (2013.01); *H05K 1/0277* (2013.01)

(58) Field of Classification Search
CPC ....... H01R 12/73; H01R 12/721; H01R 13/52
USPC ................... 439/65; 362/249, 252, 800, 231
See application file for complete search history.

(56) References Cited

U.S. PATENT DOCUMENTS

| | | | | |
|---|---|---|---|---|
| 4,227,788 | A * | 10/1980 | Shimizu | G03B 17/02 396/542 |
| 5,742,484 | A | 4/1998 | Gillette et al. | |
| 6,505,956 | B1 * | 1/2003 | Priddy | F21V 17/007 362/249.04 |
| 7,140,751 | B2 * | 11/2006 | Lin | H05B 33/0803 362/249.02 |

(Continued)

FOREIGN PATENT DOCUMENTS

| | | |
|---|---|---|
| CN | 104836045 | 8/2015 |
| GB | 2454694 | 5/2009 |

OTHER PUBLICATIONS

Fjelstad, Joseph "Flexible Circuit Technology, Third Edition," Br Publishing, Incorporated, 2007 (237 pages).

*Primary Examiner* — Peter G Leigh
(74) *Attorney, Agent, or Firm* — Pauly, DeVries Smith & Deffner LLC

(57) ABSTRACT

Embodiments include an interconnectable circuit board array. The interconnectable circuit board array includes a plurality of interconnectable circuit boards coupled together with a plurality of board to board connectors. The board to board connectors include a first lateral side conductor and a second lateral side conductor to provide electrical communication between the connect circuit boards. The board to board connectors are configured such that when two adjacent circuit boards are bent in a lateral plane with respect to one another to form an angle, one of the lateral side conductors is contracted, one of the lateral side conductors is expanded, or one of the lateral side conductors is contracted and the other lateral side conductor is expanded. Other embodiments are also included herein.

18 Claims, 12 Drawing Sheets

(56) References Cited

U.S. PATENT DOCUMENTS

| | | | |
|---|---|---|---|
| 7,551,449 B2* | 6/2009 | Yasui | H05K 1/189 |
| | | | 257/686 |
| 7,696,628 B2* | 4/2010 | Ikeuchi | H01P 1/047 |
| | | | 257/775 |
| 7,980,863 B1 | 7/2011 | Holec et al. | |
| 8,007,286 B1 | 8/2011 | Holec et al. | |
| 8,080,736 B2* | 12/2011 | DeNatale | H01L 21/768 |
| | | | 174/250 |
| 8,143,631 B2 | 3/2012 | Crandell et al. | |
| 8,593,820 B2 | 11/2013 | Suzuki et al. | |
| 8,764,237 B2* | 7/2014 | Wang | F21V 19/06 |
| | | | 362/249.05 |
| 8,851,356 B1* | 10/2014 | Holec | H05K 1/189 |
| | | | 228/103 |
| 9,524,811 B2 | 12/2016 | Adachi et al. | |
| 9,551,480 B2 | 1/2017 | Speer et al. | |
| 9,625,645 B2* | 4/2017 | Matsui | G02B 6/0073 |
| 9,706,646 B2* | 7/2017 | Jiang | H05K 1/0278 |
| 10,203,075 B1* | 2/2019 | Kim | F21S 4/28 |
| 10,418,664 B2* | 9/2019 | Jiang | H01M 2/0277 |
| 2002/0094701 A1* | 7/2002 | Biegelsen | B25J 13/084 |
| | | | 439/32 |
| 2003/0071581 A1* | 4/2003 | Panagotacos | F21V 5/04 |
| | | | 315/185 R |
| 2003/0091896 A1* | 5/2003 | Watanabe | H01M 2/1077 |
| | | | 429/158 |
| 2004/0021792 A1* | 2/2004 | Yasui | H04N 5/2253 |
| | | | 348/373 |
| 2005/0213321 A1* | 9/2005 | Lin | H05B 33/0803 |
| | | | 362/231 |
| 2011/0096545 A1* | 4/2011 | Chang | F21V 21/002 |
| | | | 362/249.02 |
| 2011/0228536 A1* | 9/2011 | Im | F21S 41/192 |
| | | | 362/249.06 |
| 2012/0243212 A1* | 9/2012 | Smith | H05K 1/028 |
| | | | 362/183 |
| 2013/0107514 A1* | 5/2013 | McNabb | F21V 21/00 |
| | | | 362/231 |
| 2014/0098535 A1* | 4/2014 | Smith | F21V 5/04 |
| | | | 362/238 |
| 2014/0247595 A1 | 9/2014 | Lind et al. | |
| 2014/0265809 A1* | 9/2014 | Hussell | H05K 1/00 |
| | | | 313/3 |
| 2014/0268779 A1* | 9/2014 | Sorensen | F21K 9/232 |
| | | | 362/249.06 |
| 2015/0189753 A1* | 7/2015 | Goyal | G06F 1/163 |
| | | | 361/803 |
| 2015/0354797 A1* | 12/2015 | Luo | H05K 1/028 |
| | | | 362/223 |
| 2016/0036142 A1 | 2/2016 | Mason et al. | |
| 2017/0059140 A1* | 3/2017 | Dubuc | H05K 1/028 |
| 2017/0059141 A1* | 3/2017 | Song | F21S 41/00 |

\* cited by examiner

INTERCONNECTABLE CIRCUIT BOARDS ADAPTED FOR LATERAL IN-PLANE BENDING

This application claims the benefit of U.S. Provisional Application No. 62/628,471, filed Feb. 9, 2018, the content of which is herein incorporated by reference in its entirety.

FIELD OF THE TECHNOLOGY

The present application relates to interconnectable circuit boards. More specifically, the present application relates to interconnectable circuit boards that can be bent in a lateral plane with respect to each other.

BACKGROUND

Lighting systems utilizing multiple emitters or light emitting diodes (hereinafter "LEDs") are used in a variety of applications including but not limited to retail displays, refrigeration and freezer door systems, under cabinet lighting, track lighting, commercial ceiling lighting, and cove lighting. Continuous strings of LEDs are often used in these applications and may be individually wired together or soldered onto printed circuit board substrates. Typical applications use standard circuit board materials such as Flame Retardant 4 (FR4) or metal core printed circuit boards, which are typically rigid.

SUMMARY

Embodiments disclosed herein include an interconnectable circuit board array. The interconnectable circuit board array can include a plurality of interconnectable circuit boards and a plurality of board to board connectors. The circuit boards can include a distal end comprising a first electrically conductive pad and a second electrically conductive pad located on a surface of the circuit board, and a proximal end comprising a third electrically conductive pad and a fourth electrically conductive pad located on the surface of the circuit board. The board to board connectors can include a first lateral side conductor to provide electrical communication between the first electrically conductive pad of a first circuit board amongst the plurality of interconnectable circuit boards and the third electrically conductive pad of a second circuit board amongst the plurality of interconnectable circuit boards, and a second lateral side conductor to provide electrical communication between the second electrically conductive pad of the first circuit board and the fourth electrically conductive pad of the second circuit board. The distal end of the first circuit board and the proximal end of the second circuit board can define a gap between the first circuit board and the second circuit board. The gap can be bridged by the first lateral side conductor and the second lateral side conductor. The board to board connectors are configured such that when the first circuit board and the second circuit board are bent in a lateral plane with respect to one another to form an angle, and one of the lateral side conductors is contracted, one of the lateral side conductors is expanded, or one of the lateral side conductors is contracted and the other lateral side conductor is expanded.

In various embodiments, the interconnectable circuit board array can further include one or more alignment tabs disposed within the gap between the first and second circuit boards, wherein removal of the alignment tab allows for the first circuit board and the second circuit board to be bent with respect to one another in a lateral plane to form an angle.

In various embodiments, the first lateral side conductor and the second lateral side conductor include a curved portion.

In various embodiments, the curved portions of the first lateral side conductor and the second lateral side conductor are curved in opposite directions from one another.

In various embodiments, the curved portions cause the alignment tabs to be closer to an adjacent lateral edge of the circuit boards than the lateral side conductors.

In various embodiments, the first lateral side conductor and the second lateral side conductor include a zigzag portion.

In various embodiments, the first lateral side conductor and the second lateral side conductor include at least two linear segments.

In various embodiments, the first lateral side conductor and the second lateral side conductor are elastically deformable.

In various embodiments, the lateral side conductors exhibit a spring force when contracted or expanded, wherein the spring force exhibited is in the opposite direction of the contracted or expanded state.

In various embodiments, the first lateral side conductor and the second lateral side conductor remain in the same horizontal plane when expanded or contracted.

In various embodiments, the board to board connectors are configured to allow the first circuit board and the second circuit board to bend in a lateral plane with respect to one another to form an angle of at least about 10 degrees.

In various embodiments, the board to board connectors are configured to allow the first circuit board and the second circuit board to bend in a lateral plane with respect to one another to form an angle of at least about 30 degrees.

In various embodiments, the board to board connectors are configured to allow the first circuit board and the second circuit board to bend in a lateral plane with respect to one another to form an angle of at least about 50 degrees.

In various embodiments, individual circuit boards amongst the plurality of interconnectable circuit boards are configured to bend in a lateral plane with respect to one another sufficiently to form a lateral plane ring.

In various embodiments, the ring has a diameter of less than 36 inches.

In various embodiments, at least one of the first and second circuit boards comprises at least a first circuit board portion and a second circuit board portion that are physically coupled in an overlapping arrangement.

In various embodiments, the board to board connector comprising an electrical insulator connected to the first lateral side conductor and the second lateral side conductor.

In various embodiments, the interconnectable circuit board array is wound around a hub of a reel.

In various embodiments, at least some of the circuit boards comprise a layered structure, wherein the layered structure comprises an electrically insulating layer interconnecting a top layer and a bottom layer.

In various embodiments, the insulating layer comprises a fiberglass composite material.

In various embodiments, the top layer and bottom layer are electrically conductive layers.

In various embodiments, the electrically conductive layers comprise copper.

In various embodiments, a component pad is disposed on a surface of at least one circuit board.

In various embodiments, a light emitting diode is coupled to the component pad.

In various embodiments, the at least one circuit board comprises an adhesive layer on an opposite surface from the component pad.

In various embodiments, the interconnectable circuit board can further include circuit paths electrically coupling the electrically conductive pads to provide electrical interconnectivity between the interconnectable circuit boards.

Some embodiments provide an interconnectable circuit board array, including a plurality of interconnectable circuit boards and a plurality of board to board connectors. The circuit boards can include a distal end comprising a first electrically conductive pad and a second electrically conductive pad located on a surface of the circuit board, and a proximal end comprising a third electrically conductive pad and a fourth electrically conductive pad located on the surface of the circuit board. The board to board connectors can include a first lateral side conductor to provide electrical communication between the first electrically conductive pad of a first circuit board amongst the plurality of interconnectable circuit boards and the third electrically conductive pad of a second circuit board amongst the plurality of interconnectable circuit boards, and a second lateral side conductor to provide electrical communication between the second electrically conductive pad of the first circuit board and the fourth electrically conductive pad of the second circuit board. The distal end of the first circuit board and the proximal end of the second circuit board define a gap between the first circuit board and the second circuit board, the gap being bridged by the first lateral side conductor and the second lateral side conductor. The board to board connectors are configured such that when the first circuit board and the second circuit board are bent in a lateral plane with respect to one another to form an angle, the board to board connectors remain in the same lateral plane.

Some embodiments provide a method of configuring an interconnectable circuit board array. The method can include obtaining the interconnectable circuit board array, wherein the interconnectable circuit board array comprises a plurality of circuit boards, wherein adjacent circuit board in the plurality of circuit boards are connected with a board to board connector, wherein a board to board connector comprises a first lateral side conductor and a second lateral side conductor, each of the first lateral side conductor and the second lateral side conductor being coupled to two adjacent circuit boards; and adjusting the position of adjacent circuit boards by contracting one of the first lateral side conductor or the second lateral side conductor and expanding one of the first lateral side conductor or the second lateral side conductor.

In various embodiments, adjusting the position of the adjacent circuit boards does not change the position of either of the first lateral side conductor or the second lateral side conductor relative to a lateral plane.

This summary is an overview of some of the teachings of the present application and is not intended to be an exclusive or exhaustive treatment of the present subject matter. Further details are found in the detailed description and appended claims. Other aspects will be apparent to persons skilled in the art upon reading and understanding the following detailed description and viewing the drawings that form a part thereof, each of which is not to be taken in a limiting sense. The scope of the present application is defined by the appended claims and their legal equivalents.

BRIEF DESCRIPTION OF THE FIGURES

The technology may be more completely understood in connection with the following drawings, in which.

While the technology is susceptible to various modifications and alternative forms, specifics thereof have been shown by way of example and drawings, and will be described in detail. It should be understood, however, that the application is not limited to the particular embodiments described. On the contrary, the application is to cover modifications, equivalents, and alternatives falling within the spirit and scope of the technology.

DETAILED DESCRIPTION

Lighting systems utilizing multiple emitters or light emitting diodes (hereinafter "LEDs") are used in a variety of applications including but not limited to retail displays, refrigeration and freezer door systems, under cabinet lighting, track lighting, commercial ceiling lighting, and cove lighting. In some scenarios, there can be a need to interconnect multiple printed circuit boards carrying LEDs to carry power from one circuit to another, as well as conductors for electronic communication, sensing and control.

However, in many scenarios, the circuit boards themselves, as well as any connectors between circuit boards are rigid, at least in a lateral plane, which prevents lateral in-plane bending and therefore prevents the circuit boards from assuming various configurations that meet the needs of the specific application. For example, it can be difficult or impossible to get circuit boards carrying LEDs to bend in-plane laterally to assume a ring shape. In other scenarios, trying to bend circuit boards in-plane can lead to portions thereof moving along a Z-axis as portions thereof twist and bunch, which can also hinder the installation of the circuit boards into a desired application.

Embodiments herein can fill a need for a flexible connector that allows a circuit board array to be configured into various arrangements featuring lateral in-plane bending. Various interconnectable circuit board arrays and associated methods are described herein. The interconnectable circuit board array can include a plurality of connected circuit boards. The circuit boards can be connected together by an electrically conductive board to board connector. The circuit board array can be configured such that the connected circuit boards can be angled or bent relative to one another in a lateral plane, such as to produce a non-linear or non-straight array of circuit boards. In some embodiments, the array can be formed into a circle or ring.

The circuit boards can be angled relative to one another and remain in the same lateral plane. Additionally, the board to board connectors can remain in the same lateral plane regardless of whether the circuit board array is arranged in a straight line, or in a bent or angled configuration. This is in contrast to a scenario where attempting to bend circuit boards in a lateral plane would result in forces causing twisting and bunching of portions thereof.

Figure 1:
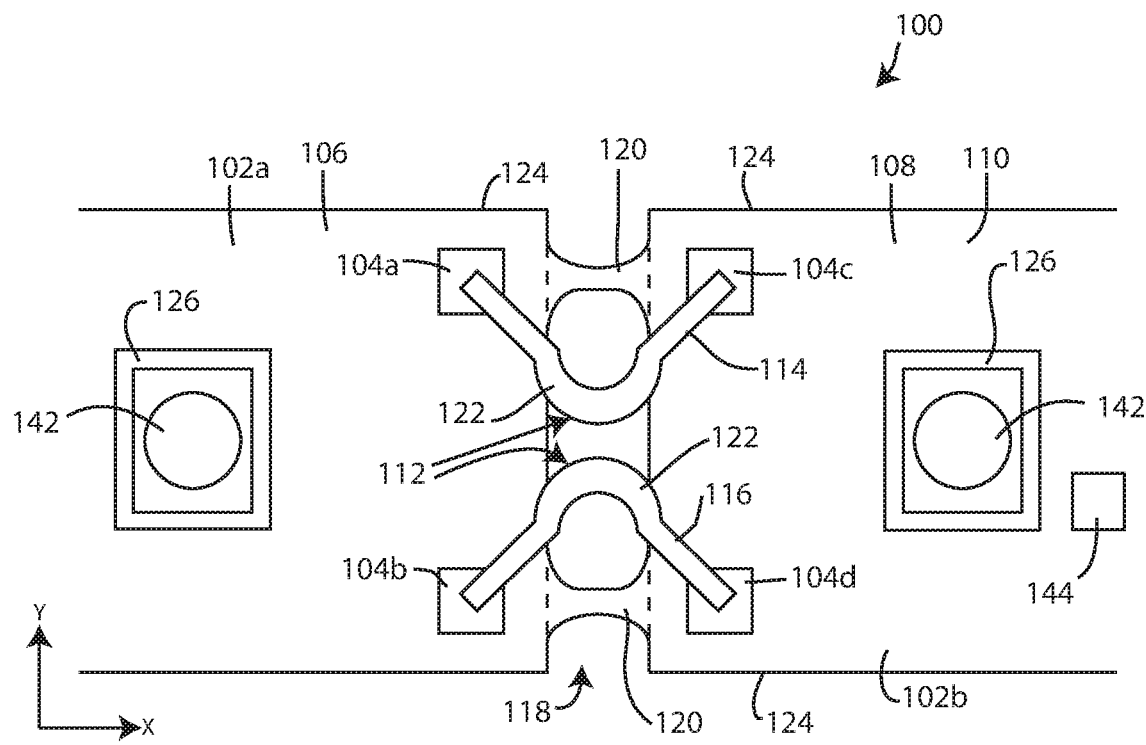
FIG. 1 is a schematic top view of two connected circuit boards, according to an embodiment.

In reference now to the figures, FIG. 1 shows a portion of an interconnectable circuit board array 100. The circuit board array 100 can include a plurality of circuit boards 102. The circuit boards 102 can include one or more electrically conductive pads 104. In some embodiments, a circuit board 102 can include a first conductive pad 104a and a second conductive pad 104b on a distal end 106 of the circuit board 102a, and a third conductive pad 104c and a fourth conductive pad 104d on a proximal end 108 of the circuit board 102b. The electrically conductive pads 104 can be located on a top surface 110 of the circuit board 102.

One or more of the circuit boards 102 in the circuit board array 100 can include one or more component pads 126 disposed on the top surface 110 of the circuit board 102. In some embodiments, there are a plurality of component pads 126 disposed on a single circuit board 102. In some embodiments, a LED 142 can be coupled to the component pad 126. The circuit boards 102 can also include circuit paths that can electrically couple the electrically conductive pads 104 and the component pads 126 to provide electrical interconnectivity between the circuit board 102 elements. Various other circuitry components 144 can also be disposed on the circuit boards 102, including, but not limited to, resistors, integrated circuits, amplifiers, capacitors, and the like.

At least some of the circuit boards 102 included in the circuit board array 100 can be connected together with a board to board connector 112. A board to board connector 112 can electrically couple a circuit board 102 to another circuit board 102. A board to board connector 112 can electrically couple one or more conductive pads 104 on a first circuit board 102a to one or more conductive pads 104 on a second circuit board 102b. In some embodiments, a board to board connector 112 can connect a distal end 106 of a first circuit board 102a with a proximal end 108 of a second circuit board 102b. In some embodiments, the board to board connector 112 can be attached to one or more conductive pads 104 on the distal end 106 of a first circuit board 102a and attached to one or more conductive pads 104 on a proximal end 108 of a second circuit board 102b thereby electrically coupling the two circuit boards 102.

In various embodiments, a board to board connector 112 can include a first lateral side conductor 114 and a second lateral side conductor 116. The first lateral side conductor 114 and the second lateral side conductor 116 can be electrically conductive. The first lateral side conductor 114 and the second lateral side conductor 116 can be formed of a metal, such as copper, aluminum, gold, silver, alloys including one or more of these, or the like. The first lateral side conductor can provide electrical communication between a conductive pad 104 on a first circuit board 102a and a conductive pad 104 on a second circuit board 102b within the circuit board array 100. The second lateral side conductor 116 can provide electrical communication between a second conductive pad 104 on the first circuit board 102a and a second conductive pad 104 on the second circuit board 102b. The lateral side conductors 114, 116 can include an electrically conductive material, such as copper.

In some embodiments, the first lateral side conductor 114 can be located in the same lateral plane as the second lateral side conductor 116. The first lateral side conductor 114 and the second lateral side conductor can be mirrored copies of each other. In many embodiments, the lateral side conductors 114, 116 can include at least one axis of symmetry.

A gap 118 can be defined between two adjacent circuit boards 102a, 102b. The gap 118 can be open space between the proximal end 108 of one circuit board 102b and the distal end 106 of the adjacent circuit board 102a. The first lateral side conductor 114 and the second lateral side conductor 116 can each bridge the gap 118. The gap 118 can allow the circuit boards to be bent with respect to one another in a lateral plane to form an angle. In the bent configuration, one end of the gap 118 can be reduced in sized and the other end of the gap 118 can be increased in size. In some embodiments, one or more alignment tabs 120 can be disposed within the gap 118, such as when the circuit boards are aligned as shown in FIG. 1.

Figure 4:
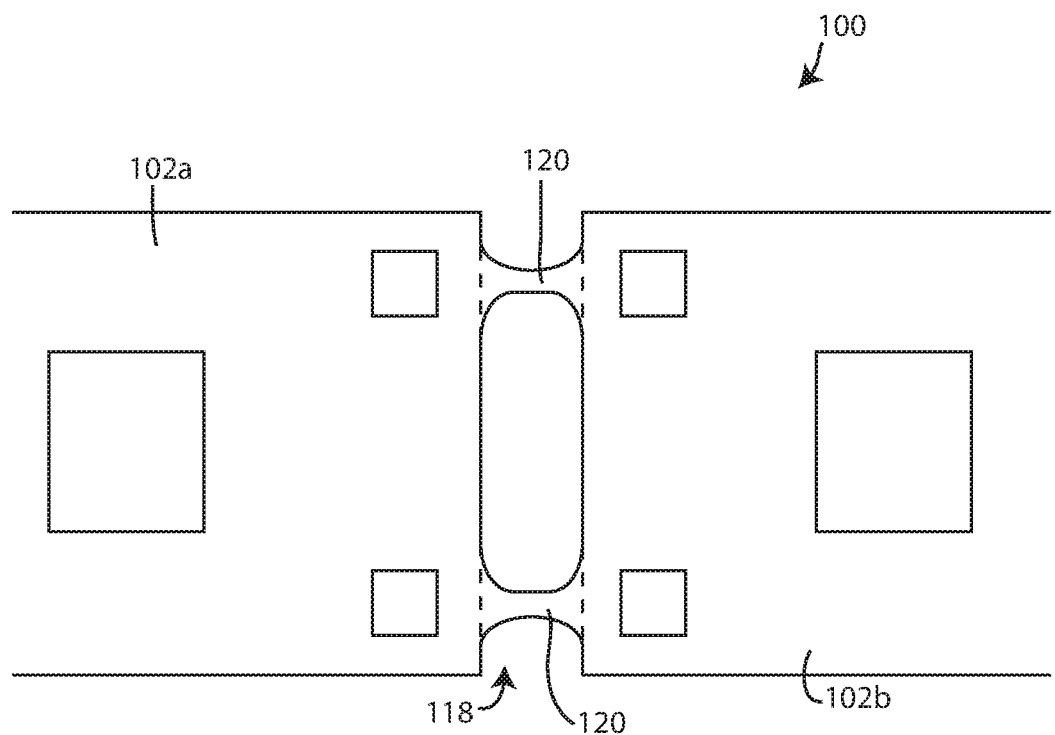
FIG. 4 is a schematic top view of two connected circuit boards without a board to board connector, according to an embodiment.

FIG. 4 shows a gap 118 between two adjacent circuit boards 102a, 102b. For clarity, the embodiment shown in FIG. 4 is depicted without the board to board connectors electrically coupling the conductive pads of the two circuit boards. FIG. 4 shows the gap 118 having a consistent width along its length. The length of the gap can be perpendicular to the longitudinal axis of the circuit boards. The length of the gap can be equivalent to the width of the circuit boards, when the circuit boards are arranged in-line with each other. The width of the gap can vary. The width of the gap can be about 0.1, 0.5, 1, 1.5, 2, 2.5, 3, 3.5, 4, 4.5, 5, 8, 10 or 15 millimeters, or can be within a range wherein any of the foregoing can serve as the upper or lower bound of the range.

In various embodiments, one or more alignment tabs 120 can be disposed between two adjacent circuit boards 102, such as in the gap 118. The alignment tabs 120 can be attached or coupled to each of the adjacent circuit boards 102 that define a gap 118. The alignment tabs 120 can be configured to keep the two adjacent circuit boards in-line with each other, such that corresponding edges that define the gap 118 are parallel or the longitudinal axis of the two adjacent circuit boards 102 are in-line with each other. The alignment tabs 120 can be configured to maintain the size and shape of the gap 118 between two adjacent circuit boards 102. The removal of the alignment tabs 120 between two circuit boards 102 can allow the circuit boards 102 to be bent with respect to one another.

The length of a lateral side conductor can be longer than the distance between the two conductive pads 104 that the lateral side conductor is connected to, such as to allow the distance between the two conductive pads 104 to be modified. The lateral side conductors 114, 116 can be bendable, flexible, or deformable (in some cases elastically deformable), such that the circuit boards can be bent into an angled configuration and then bent back into an in-line configuration.

In some embodiments, the lateral side conductors 114, 116 can include at least two linear segments connecting at an angle, such as to form a "V" shape. In various embodiments, the first lateral side conductor 114 and the second lateral side conductor 116 can include a curved portion 122. The curved portion 122 can be curved inward or outward relative to a center longitudinal axis of the circuit boards.

In various embodiments, the curved portion 122 of the first lateral side conductor 114 and the curved portion 122 of the second lateral side conductor 116 are curved in opposite directions from one another. In some embodiments, the curved portions 122 can curvature of at least 15, 30, 45, 60, 75, 90, 105, 120, 135, 150, 165 or at least 180 degrees, or an amount of curvature falling within a range between any of the foregoing.

In some embodiments, the curved portions 122 are configured to cause the alignment tabs 120 to be closer to an adjacent lateral edge 124 of the circuit boards than the lateral side conductors 114, 116, such as to allow the removal of the alignment tabs 120 without affecting the lateral side conductors 114, 116. In this manner, a cutting instrument inserted from the lateral edge of the circuit boards will encounter the alignment tabs 120 before the nearest lateral side conductor. This can facilitate quick and easy removal of the alignment tabs 120.

Figure 2:
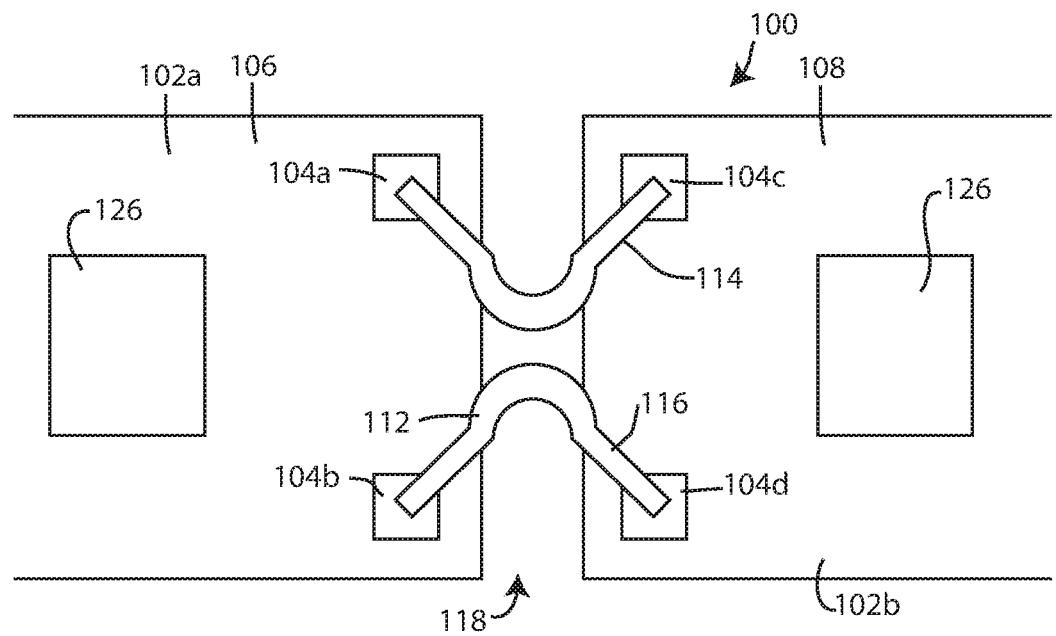
FIG. 2 is a schematic top view of two connected circuit boards, according to an embodiment.
Figure 3:
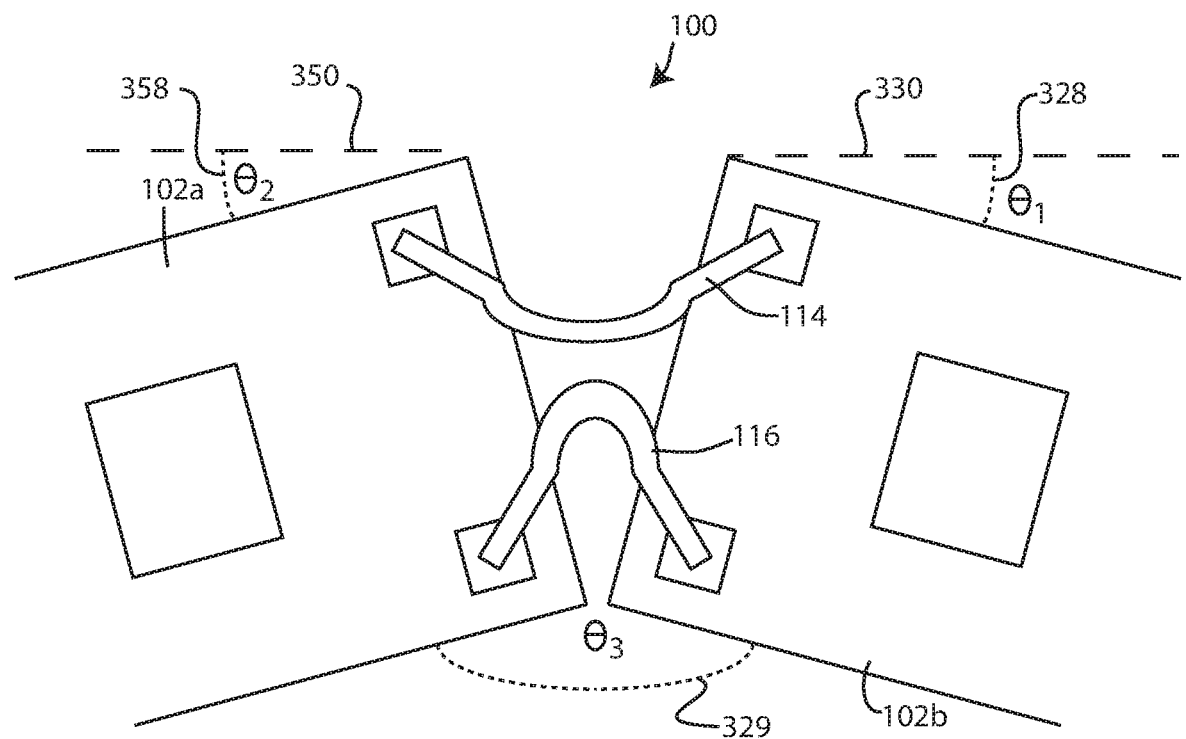
FIG. 3 is a schematic top view of two connected circuit boards bent in a lateral plane, according to an embodiment.
Figure 11:
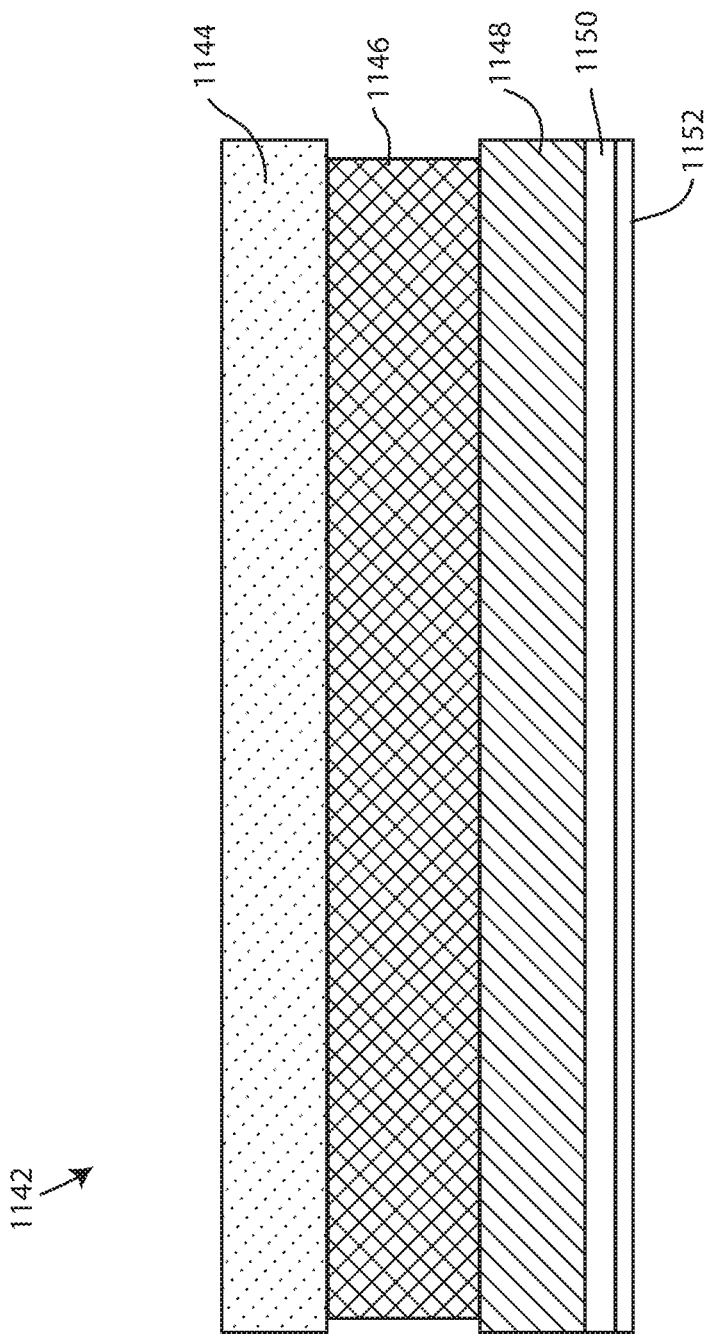
FIG. 11 is a schematic side view of a circuit board, according to an embodiment.

FIGS. 1-3 show a circuit board array 100 in various configurations. FIG. 1 shows the first circuit board 102a parallel or in-line with the second circuit board 102b. Two adjacent circuit boards 102 can be in-line, such as when the alignment tabs 120 have not been removed. Adjacent circuit boards can be straight in-line when dispensing a circuit board array 100 from a reel, such as shown in FIG. 11. The circuit boards can be arranged in a straight line as they are coupled together during a manufacturing process.

FIG. 2 shows two circuit boards 102 that are in-line. In contrast to FIG. 1, the embodiment shown in FIG. 2 has had the alignment tabs 120 removed, such as by cutting or otherwise separating them from the circuit boards 102. Removing the alignment tabs 120 from between two adjacent circuit boards 102 can allow the two adjacent circuit boards 102 to be bent relative to each other, such as to form an angle.

FIG. 3 shows a top view of two connected circuit boards 102 bent in a lateral plane. A lateral or horizontal plane can extend along the x-axis (longitudinal) and y-axis (latitudinal) shown in FIG. 1. The board to board connectors 112 can be configured such that when the two adjacent circuit boards 102 that are coupled by a board to board connector 112 are bent in a lateral plane with respect to one another to form an angle, one of the lateral side conductors is contracted, one of the lateral side conductors is expanded, or one of the lateral side conductors is contracted and one of the lateral side conductors is expanded. The lateral side conductor that is inward towards the angle can be contracted, while the lateral side conductor that is towards the exterior of the angle can be expanded. In the embodiment shown in FIG. 3, the first lateral side conductor 114 is expanded and the second lateral side conductor 116 is contracted. In the expanded state the two ends of the lateral side conductor can be further away from each other than they initially were, such as seen when comparing the first lateral side conductor 114 in FIG. 1 with first lateral side conductor 114 in FIG. 3. In contrast, in the contracted state the two ends of the lateral side conductor can be closer together than they initially were, such as seen when comparing the second lateral side conductor 116 in FIG. 1 with the second lateral side conductor 116 in FIG. 3. Notably, the board to board connectors 112 can be configured so that they exhibit little or no movement along a z-axis (shown in FIG. 7) when adjacent circuit boards are bent in a lateral plane with respect to one another to form an angle. In some embodiments, there can be less than 5, 4, 3, 2, 1, 0.5 or 0.1 millimeters of movement in the z-axis when adjacent circuit boards are bent in a lateral plane with respect to one another to form an angle.

In various embodiments, the lateral side conductors can exhibit a spring force when contracted or expanded. A lateral side conductor that is expanded can exhibit a spring force that applies a force to contract the lateral side conductor. The contracting force can be a force that is directed towards returning the lateral side conductor to its original or non-expanded state. However, in some cases the spring force exhibited by the lateral side conductor is insufficient to contract the lateral side conductor or move the positions of the circuit boards without an additional force being applied from an external source, such as that from a user or a machine. Similarly, the opposite is true for a lateral side conductor that is contracted. The contracted lateral side conductor can exhibit a spring force that applies a force to expand the lateral side conductor. However, the expanding spring force can be insufficient to expand the lateral side conductor from the contracted state without an external force being applied.

In various embodiments, the board to board connectors 112 are configured to allow the first circuit board 102a and the second circuit board 102b to bend in a lateral plane with respect to one another to form an angle 329 (theta 3). The board to board connectors 112 can be flexible or bendable to allow adjacent circuit boards 102 to be configured in different positions. Each of the circuit boards 102 can be bent away from the in-line position to form an angle 328, 358. Angle 328 (theta 1) can be an angle between the in-line position of a circuit board represented by line 330 and the bent or angled position of the circuit board. Angle 358 (theta 2) can be an angle between the in-line position of a circuit board represented by line 350 and the bent or angled position of the circuit board. In this view, theta 3 can be equal to 180 minus the sum of theta 1 and theta 2. Theta 1 and theta 2 can, independently, be 0, 0.01, 1, 3, 5, 10, 15, 20, 30, 40, 50, 60, 70, 80, or 90 degrees, or can be within a range between any of the foregoing.

In some embodiments, the first circuit board 102a and the second circuit board 102b are bent away from the in-line position to form an angle 328 of at least about 10 degrees. In some embodiments, the first circuit board 102a and the second circuit board 102b are bent away from the in-line position to form an angle 328 of at least 20 degrees. In some embodiments, the first circuit board 102a and the second circuit board 102b are bent away from the in-line position to form an angle 328 of at least 30 degrees. In some embodiments, the first circuit board 102a and the second circuit board 102b are bent away from the in-line position to form an angle 328 of at least 40 degrees. In some embodiments, the first circuit board 102a and the second circuit board 102b are bent away from the in-line position to form an angle 328 of at least 50 degrees.

Figure 5:
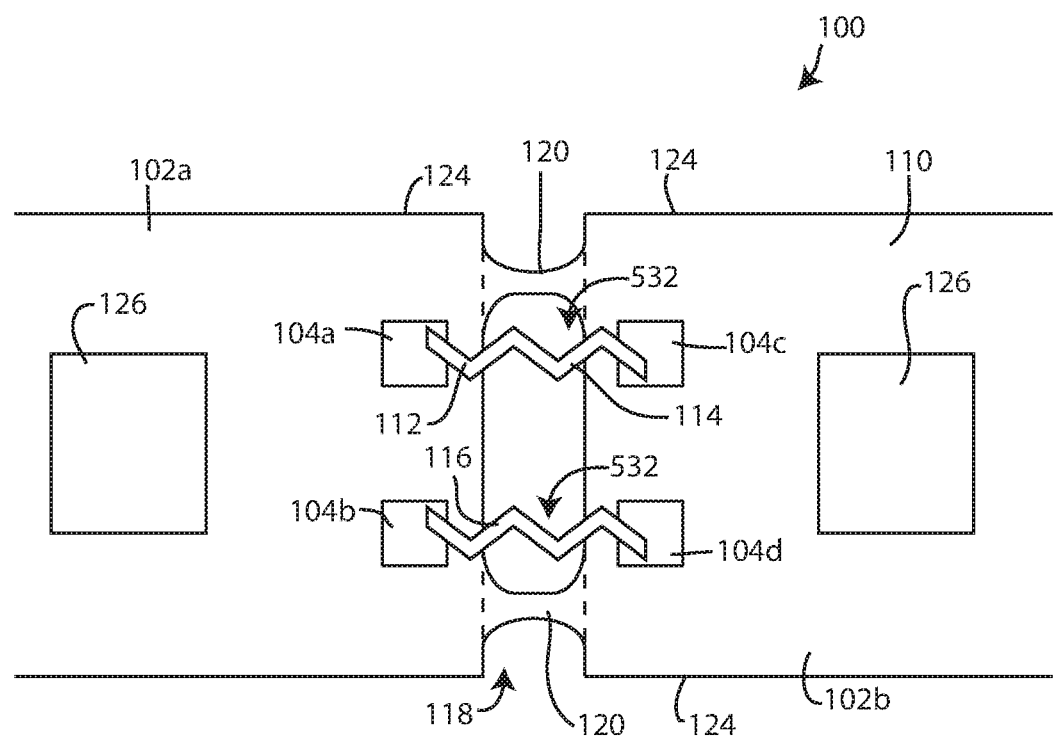
FIG. 5 is a schematic top view of two connected circuit boards, according to an embodiment.
Figure 6:
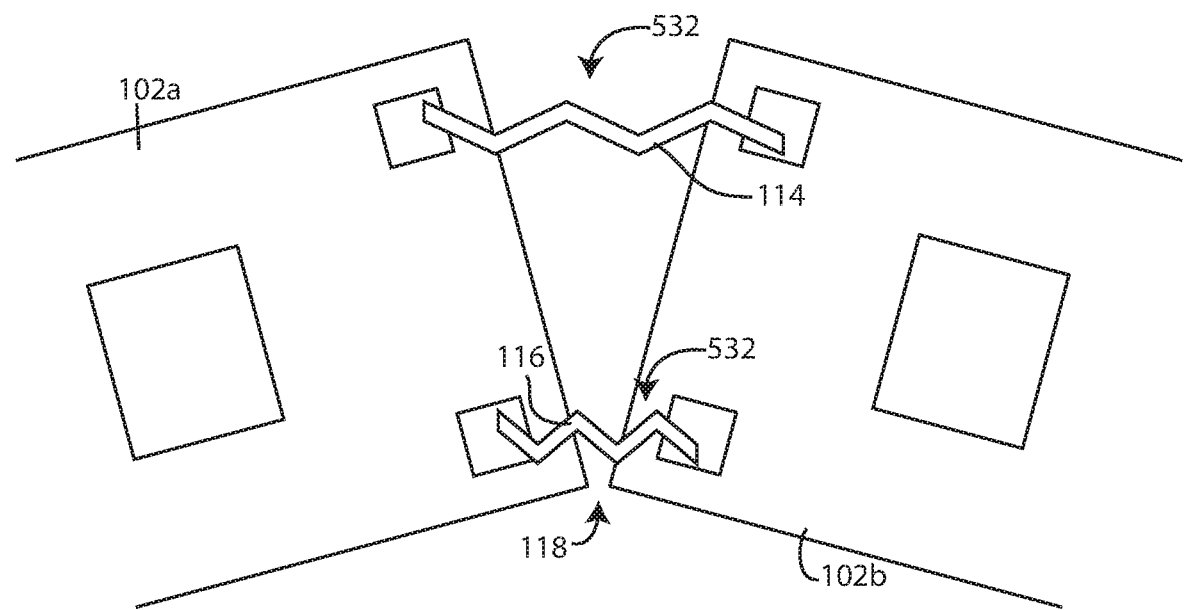
FIG. 6 is a schematic top view of two connected circuit boards bent in a lateral plane, according to an embodiment.

FIGS. 5 and 6 show an additional embodiment of the lateral side conductors 114, 116. FIG. 5 shows a top view of two connected circuit boards in an in-line configuration. FIG. 6 shows a top view of two connected circuit boards bent in a lateral plane. In FIG. 6, the first lateral side conductor 114 is in an expanded state and the second lateral side conductor 116 is in a contracted state. The length of each lateral side conductor 114, 116 can be greater than the distance between the two conductive pads 104 which the lateral side conductor 114, 116 is coupled to when the boards are in an in-line configuration, such as shown in FIG. 5. The length of the lateral side conductors 114, 116 being great than the distance between the two conductive pads 104 that the lateral side conductor 114, 116 is coupled to can facilitate movement between the circuit boards 102, such that the distance between the two conductive pads 104 can be increased, such as seen when comparing the first lateral side conductor 114 in FIG. 5 with the first lateral side conductor 114 in FIG. 6.

In some embodiments, the lateral side conductors 114, 116 can include a zigzag portion 532. The zigzag portion 532 can include alternating right and left turns or switchback portions. In some embodiments, the zigzag portions 532 can include one right turn and one left turn. The lateral side conductors 114, 116 can exhibit a spring force when contracted that is in the direction of expanding the lateral side conductor 114, 116. Similarly, the lateral side conductors 114, 116 can exhibit a spring force when expanded that is in the direction of contracting the lateral side conductor 114, 116. However, in other embodiments, the lateral side conductors 114, 116 do not exhibit a spring force when expanded and/or contracted.

The board to board connectors 112 can be configured to allow the first circuit board 102a and the second circuit board 102b to bend in a lateral plane to form an angle away from an in-line position of at least 10 degrees. In other embodiments, the board to board connectors 112 can be configured to allow the circuit boards 102 to form an angle of at least 20 degrees, at least 30 degrees, at least 40 degrees, or at least 50 degrees relative to their in-line positions.

Figure 7:
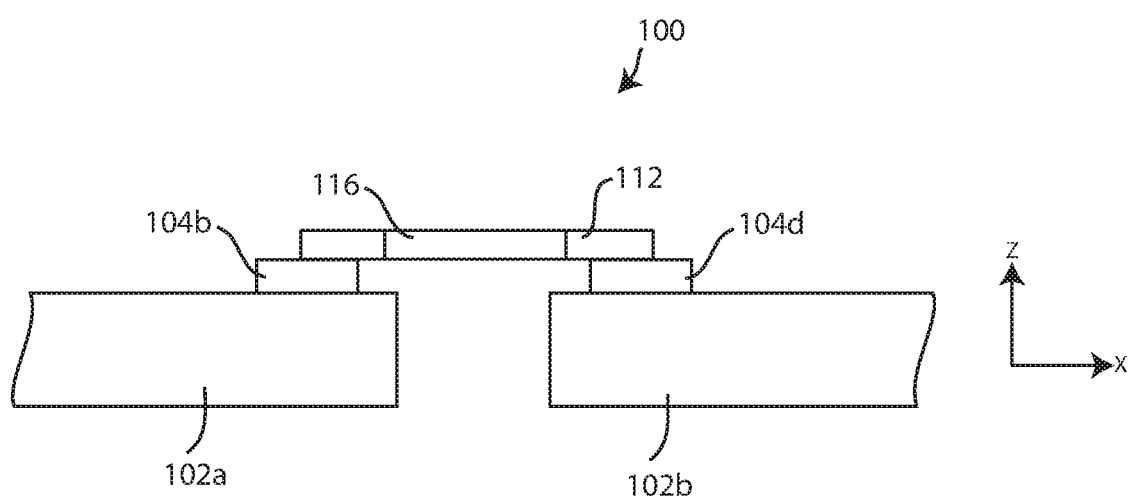
FIG. 7 is a schematic side view of two connected circuit boards, according to an embodiment.

As mentioned above, two adjacent circuit boards 102 can be bent relative to each other and remain in the same lateral or horizontal plane. FIG. 7 shows a side view of two connected circuit boards 102 that are angled relative to each other, according to an embodiment. In various embodiments, the board to board connectors 112, as well as the lateral side conductors 114, 116, can remain in the same horizontal or lateral plane when the lateral side conductors are expanded or contracted (such as shown in FIG. 3) as they are in when they are neither expanded nor contracted (such as shown in FIG. 1). In various embodiments, adjusting the circuit boards 102 relative to each other to form an angle in the lateral plane can result in no change or minimal change of the circuit boards 102 or the board to board connectors 112 in the vertical direction (represented by the z-axis). Therefore, the plane that includes the lateral side conductors 114, 116 in FIG. 7 can be the same plane that includes the lateral side conductors 114, 116 when the two boards are not bent relative to each other.

Figure 8:
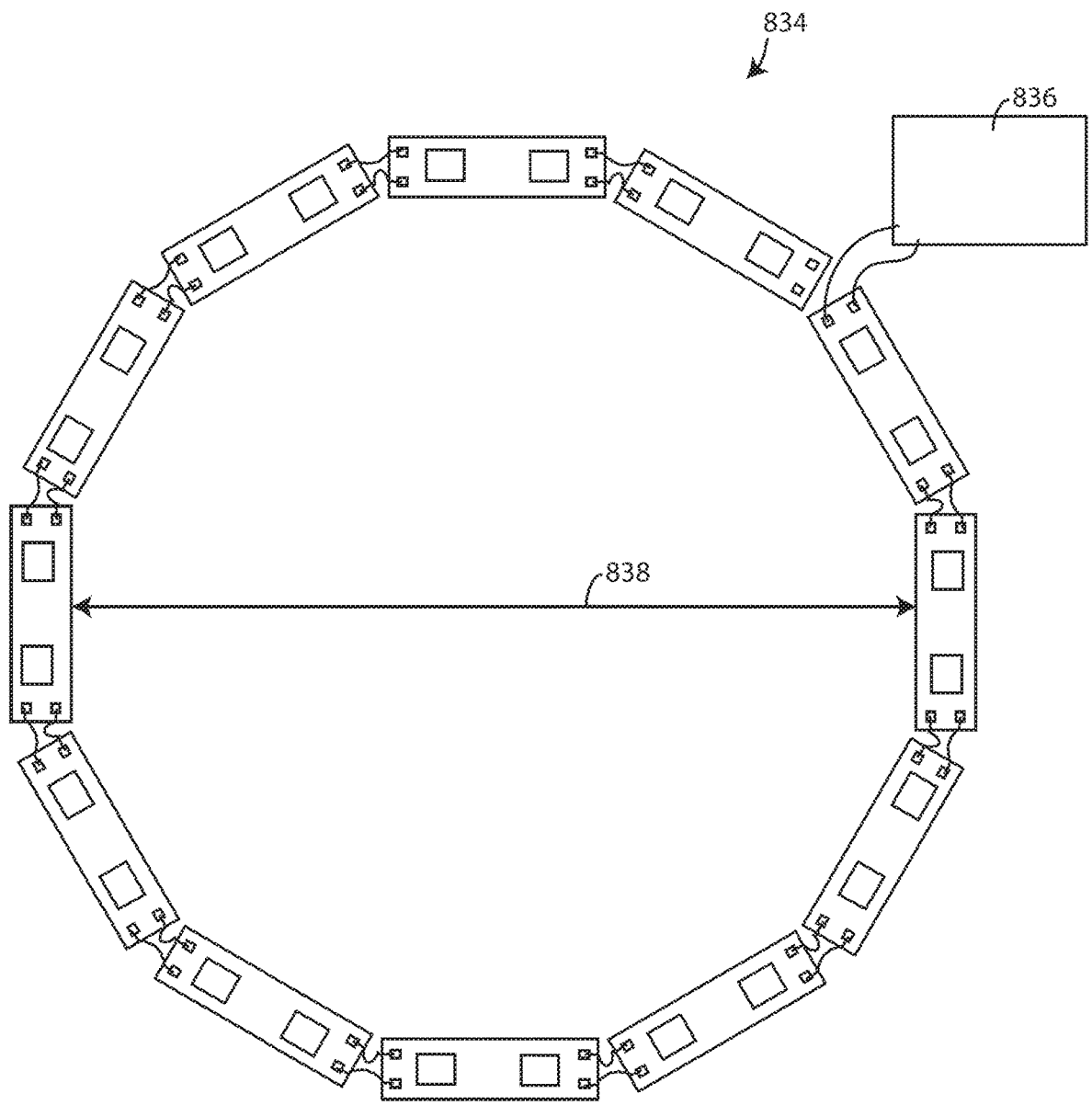
FIG. 8 is a schematic top view of a plurality of circuit boards connected in a ring, according to an embodiment.

The ability to bend laterally in-plane can be very useful in forming certain shapes with the LED carrying circuit boards. By way of example, FIG. 8 is a top view of a circuit board array arranged in a ring 834, according to an embodiment. The circuit board 102 of the interconnectable circuit board array 100 can be configured to bend relative to one another while remaining in the same lateral plane. The circuit boards 102 can be bent with respect to one another such that the array forms a lateral plane ring 834 or circle, as shown in FIG. 8. In some embodiments, the circuit board array 100 can define at least 270 degrees of a ring, at least 285 degrees of a ring, at least 300 degrees of a ring, at least 315 degrees of a ring, at least 330 degrees of a ring, or at least 345 degrees of a ring.

In various embodiments, one end of the circuit board array 100 can be coupled to a power source 836, such as to provide power to the component pads on the circuit boards 102.

Figure 9:
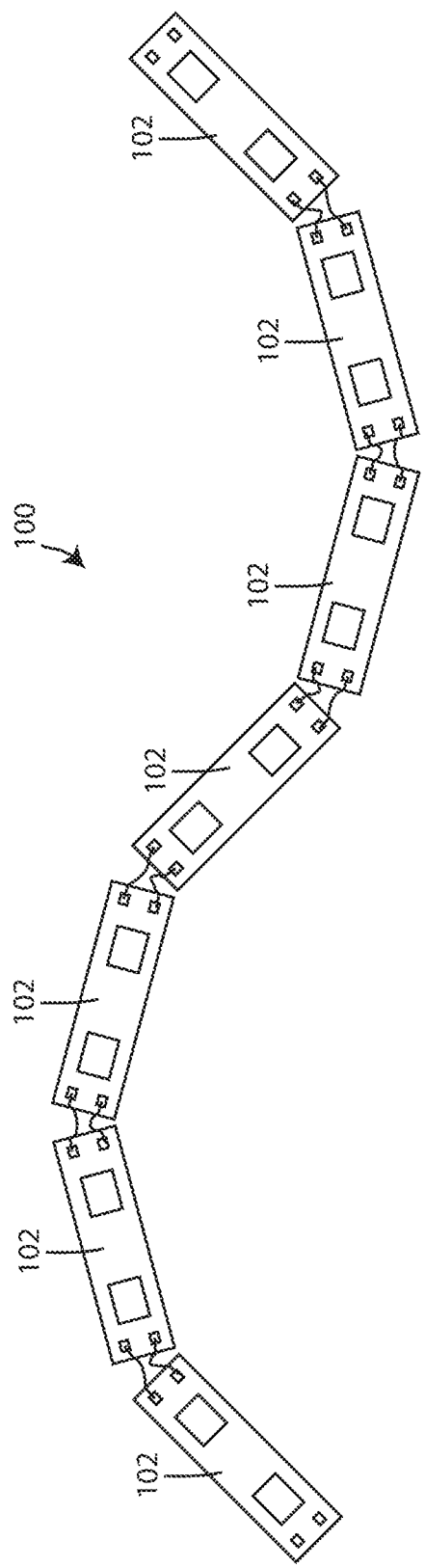
FIG. 9 is a schematic top view of a plurality of connected circuit boards, according to an embodiment

In various embodiments, the ring 834 can have a diameter 838 of less than 48, 36, 34, 32, 30, 28, 26 or 24 inches. In various embodiments, the ring 834 can have a diameter 838 of at least 12, 14, 16, 18, 20, 22 or 24 inches. In some embodiments, the ring 834 can have a diameter 838 of at least 26, 28, 30, 32, 34, 36, or 48 inches. In various embodiments, the ring 834 can have a diameter 838 falling within a range wherein any of the foregoing sizes can serve as the upper or lower bound of the range. FIG. 9 is a top view of a plurality of connected circuit boards, according to an embodiment. In some embodiments, the circuit board array 100 can include a plurality of board to board connectors 112 that are bent in one direction and a plurality of board to board connectors 112 bent in a second direction that is opposite to the first direction, such as the first direction being concave and the second direction being convex or the first direction being concave to the right and the second direction being concave to the left. In some embodiments, the board to board connectors 112 can alternate in the direction in which they are bent. In some embodiments sections of the array can alternate in the direction in which they are bent, such as shown in FIG. 9. In other embodiments, an array can include some section that are bent and some sections that are straight.

Figure 10:
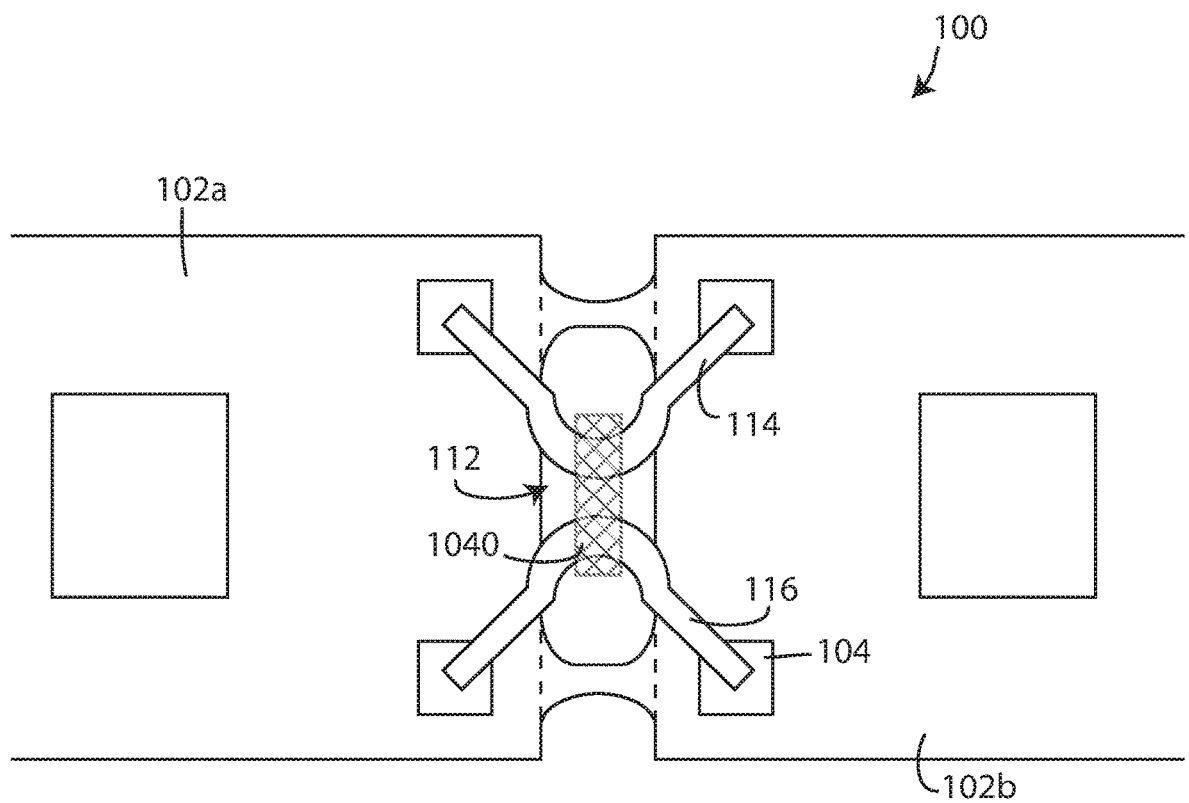
FIG. 10 is a schematic top view of two connected circuit boards, according to an embodiment.

FIG. 10 shows a top view of two circuit boards 102 connected by a board to board connector 112. In some embodiments, the board to board connector 112 can include an insulator 1040. The insulator 1040 can surround at least a portion of one or both of the lateral side conductors 114, 116. The insulator 1040 can be configured to prevent the lateral side conductors 114, 116 from contacting each other when the boards are in-line or when the boards are bent. In some embodiments, the insulator 1040 can be a single element that protects or covers both lateral side conductors 114, 116, such as shown in FIG. 10.

In other embodiments, the insulator 1040 can include a first portion which protects or covers the first lateral side conductor 114 and a second portion which protects or covers the second lateral side conductor 116. The first portion and the second portion of the insulator 1040 can be separate from each other or define a gap between them. In other embodiments, the first portion and the second portion of the insulator 1040 can contact each other. In some embodiments, the insulator 1040 can cover some or all of the lateral side conductors.

In various embodiments, at least some of the circuit boards 102 can include a layered structure 1142, such as described in U.S. patent application Ser. No. 12/043,424 filed on Mar. 6, 2008, issued as U.S. Pat. No. 8,143,631, which is herein incorporated by reference in its entirety. FIG. 11 shows a cross-sectional side view of a circuit board 102 showing the layered structure 1142. The layered structure 1142 can include an electrically insulating layer 1146 interconnecting a top layer 1144 and a bottom layer 1148. In various embodiments, the conductive pads 104 or component pads 126 can be located on the top layer 1144. In some embodiments, one or more circuit boards 102 can include an adhesive layer 1150 on an opposite surface from the conductive pads 104 or component pads 126. Further, there can be a backing layer 1152 covering the adhesive layer 1150. The backing layer 1152 can be removed from the adhesive layer 1150 to expose the adhesive layer 1150, such as prior to attaching the circuit board 102 to a surface via the adhesive layer 1150.

In various embodiments, the top layer 1144 and the bottom layer 1148 are electrically conductive layers. The electrically conductive layers can include copper. In some embodiments, the electrically insulating layer 1146 can include a fiberglass composite material.

Figure 12:
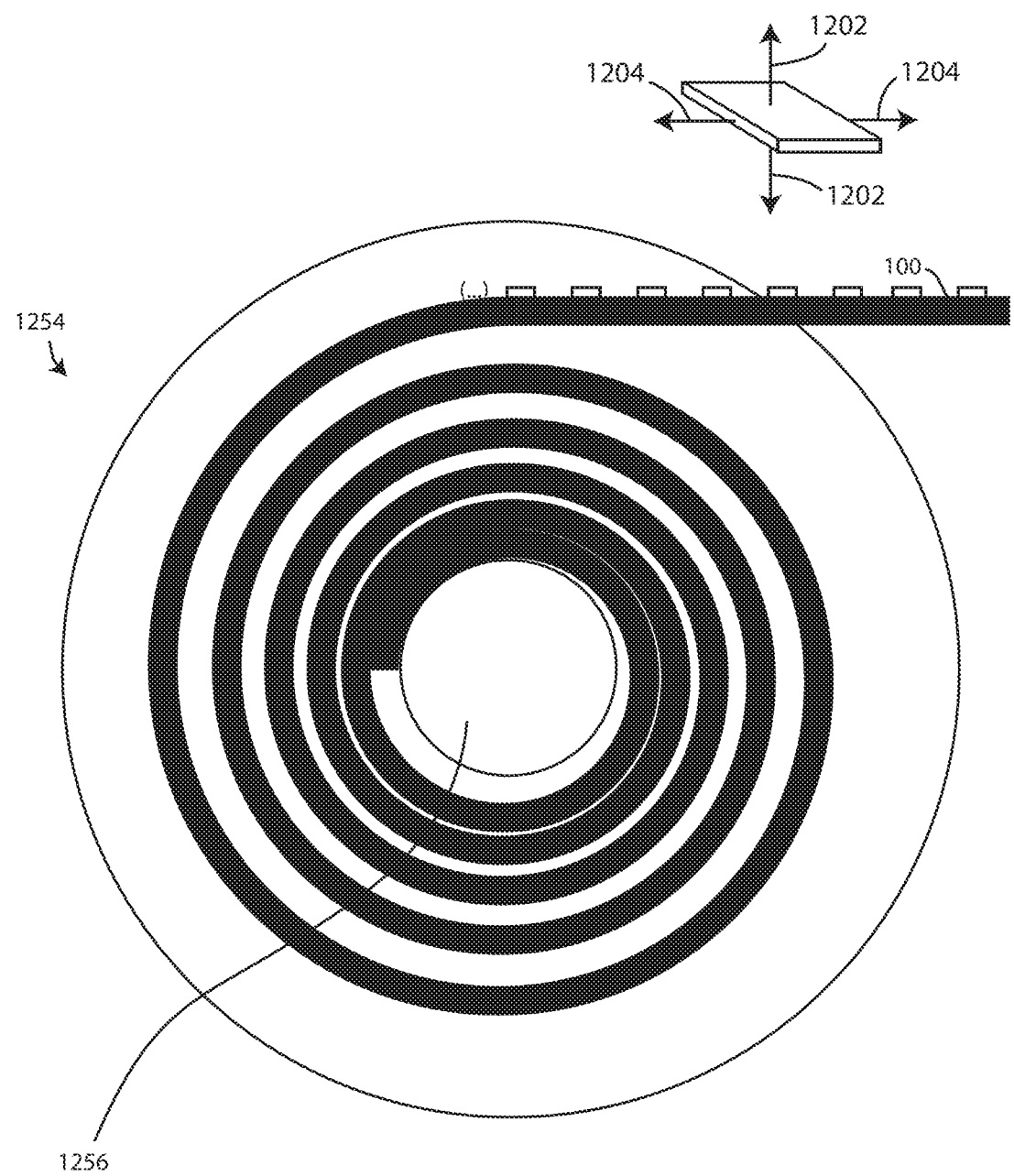
FIG. 12 is a schematic side view of a circuit board array being wound on a reel, according to an embodiment.

The structure of the circuit boards 102 can allow the circuit boards 102 to bend or curve around a latitudinal axis (e.g., in the direction of arrows 1202 versus lateral in-plane bending which is in the direction of arrows 1204) of the circuit boards 102, such as around an axis parallel to the y-axis shown in FIG. 1. FIG. 12 shows a side view of a circuit board array 100 being wound on to the hub 1256 of a reel 1254. The circuit boards in the circuit board array 100 shown in FIG. 12 are curved or bent around a latitudinal axis to allow the circuit board array 100 to be wound around the hub 1256.

Bending or curving the circuit boards around a latitudinal axis allows the array to be wound around the hub 1256, such as during the manufacturing process of the circuit board array 100. Sections of the circuit board array 100 can be dispensed off of the reel 1254 as needed. The circuit board array 100 can be cut or separated into desired lengths.

In various embodiments, the circuit board array 100 can include a plurality of circuit boards 102. In some instances, the circuit boards 102 can be connected with board to board connectors 112 as described above. In some embodiments, some of the circuit boards 102 can be connected with each other in an overlapping arrangement 1364, such as described in U.S. patent application Ser. No. 12/372,499 filed on Feb. 17, 2009, issued as U.S. Pat. No. 7,980,863, which is herein incorporated by reference in its entirety, and also described in U.S. patent application Ser. No. 12/406,761 filed on Mar. 18, 2009, issued as U.S. Pat. No. 8,007,286, which is herein incorporated by reference in its entirety.

Figure 13:
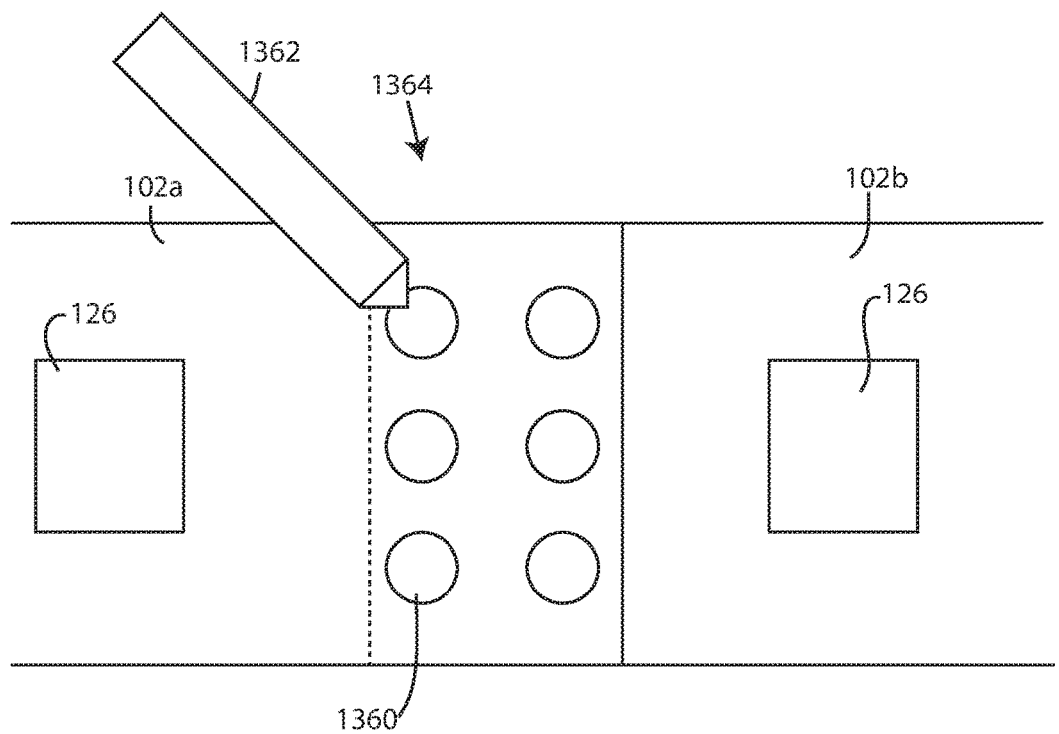
FIG. 13 is a schematic top view of two circuit boards portions being connected together, according to an embodiment.
Figure 14:
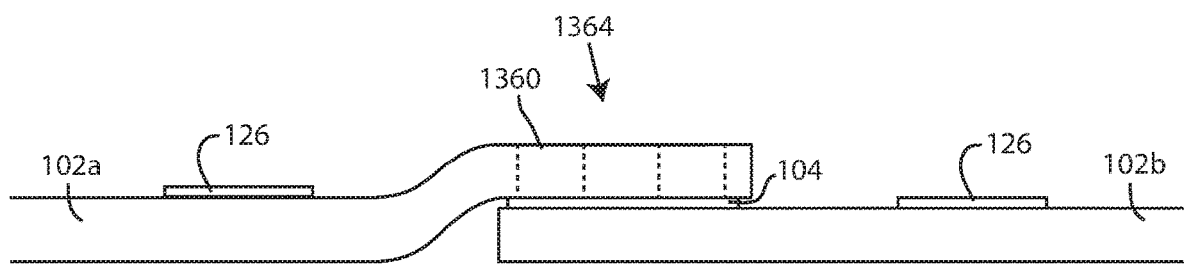
FIG. 14 is a schematic side view of the two circuit board portions being connected together from FIG. 13.

FIGS. 13 and 14 show two circuit boards 102 connected in an overlapping arrangement 1364. FIG. 13 shows two circuit boards being connected in an overlapping arrangement 1364. FIG. 14 shows a side view of the two circuit boards 102 connected in an overlapping arrangement 1364. A plurality of plated through-holes 1360 can be disposed in one of the two circuit boards 102. The plated through-holes 1360 can be used as receptacles for solder paste so the boards can be ready for joining by heat alone. The circuit board 102 with the plurality of plated through-holes 1360 can be disposed on top of the other circuit board 102. Once the circuit boards 102 are aligned they can be heated, for example using a soldering iron 1362, in the area of the overlapping arrangement 1364 to cause the solder to begin melting. By capillary action and wetting, the solder can quickly flow into the space between the boards and conductive pads 104 completing the connection between the two circuit boards 102. FIGS. 13 and 14 show a series of six plated through-holes 1360, though it will be appreciated that other numbers are contemplated herein.

Figure 15:
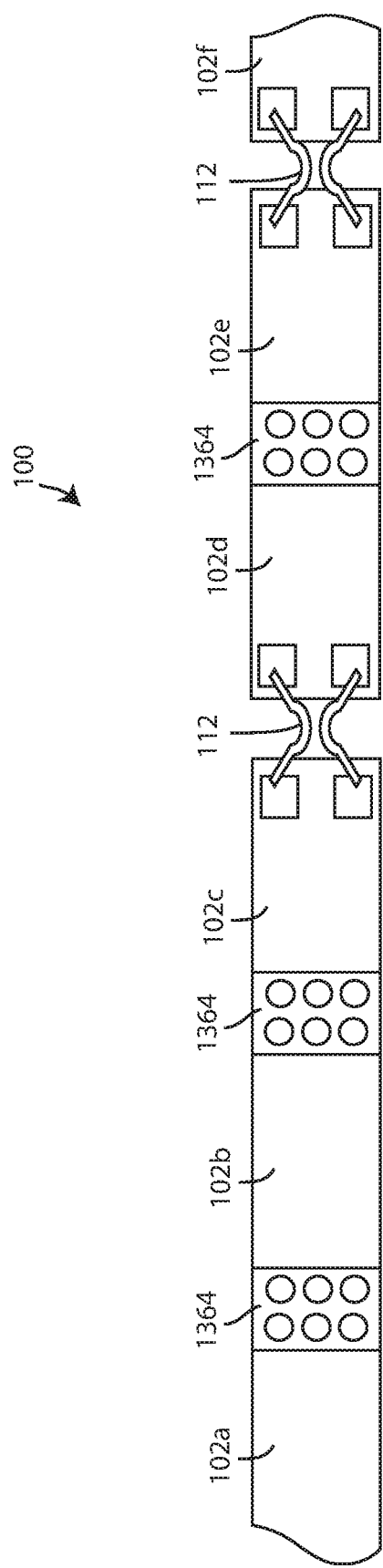
FIG. 15 is a schematic top view of a plurality of connected circuit boards, according to an embodiment.

FIG. 15 shows a circuit board array 100 that includes a plurality of circuit boards 102a-f. In some instances, the circuit boards 102a, 102b are connected together in an overlapping arrangement 1364. In other instances, the circuit boards 102c, 102d are connected together with a board to board connecter 112 described in FIGS. 1-10. In some embodiments, there are one, two, three, four, or more overlapping arrangements 1364 between each board to board connector 112 with lateral side conductors.

Various methods are also included herein. For example, methods of forming a lighting device using a circuit board array are included herein as well as methods of making a circuit board array.

Figure 16:
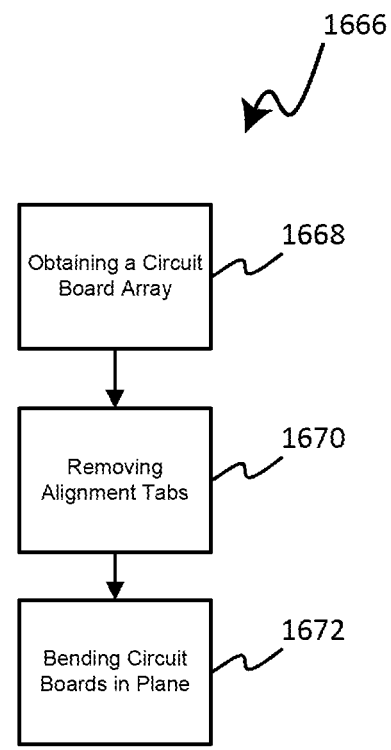
FIG. 16 shows a method of forming a circuit board array, according to an embodiment.

Referring now to FIG. 16, a method 1666 of forming a lighting device using a circuit board array is shown. In various embodiments, the method 1666 can include obtaining a circuit board array, step 1668. In some embodiments, the circuit board array can be dispensed from a reel, such as shown in FIG. 12. The desired length or size of the array can be removed from the reel and cut or separated from the portion that remains on the reel.

Once the circuit board array has been obtained, the alignment tabs can be removed from between circuit boards that will be bent relative to each other, step 1670. For example, an array with the alignment tabs removed can be seen in FIG. 2. After the alignment tabs are removed, the boards can be bent or angled, step 1672. The boards being bent relative to each other can be seen in FIG. 3. In another step, a backing layer can be removed to expose an adhesive layer. In some embodiments, the boards can then be fastened down to a substrate. In some embodiments, leads to facilitate connection to an electrical power source can be soldered to conductive pads on an end of a plurality of interconnected circuit boards.

In an embodiment, a method of configuring an interconnectable circuit board array is included. The method can include obtaining the interconnectable circuit board array. The interconnectable circuit board array can include a plurality of circuit boards, wherein adjacent circuit boards in the plurality of circuit boards are connected with a board to board connector. The board to board connector including a first lateral side conductor and a second lateral side conductor, each of the first lateral side conductor and the second lateral side conductor being coupled to two adjacent circuit boards. The method can further include adjusting the position of adjacent circuit boards by contracting one of the first lateral side conductor or the second lateral side conductor and expanding one of the first lateral side conductor or the second lateral side conductor. In various embodiments, adjusting the position of the adjacent circuit boards does not change the position of either of the first lateral side conductor or the second lateral side conductor relative to a lateral plane.

The embodiments of the present technology described herein are not intended to be exhaustive or to limit the technology to the precise forms disclosed in the following detailed description. Rather, the embodiments are chosen and described so that others skilled in the art can appreciate and understand the principles and practices of the present technology.

All publications and patents mentioned herein are hereby incorporated by reference. The publications and patents disclosed herein are provided solely for their disclosure. Nothing herein is to be construed as an admission that the inventors are not entitled to antedate any publication and/or patent, including any publication and/or patent cited herein.

It should be noted that, as used in this specification and the appended claims, the singular forms "a," "an," and "the" include plural referents unless the content clearly dictates otherwise. Thus, for example, reference to a composition containing "a compound" includes a mixture of two or more compounds. It should also be noted that the term "or" is generally employed in its sense including "and/or" unless the content clearly dictates otherwise.

It should also be noted that, as used in this specification and the appended claims, the phrase "configured" describes a system, apparatus, or other structure that is constructed or configured to perform a particular task or adopt a particular configuration to. The phrase "configured" can be used interchangeably with other similar phrases such as arranged and configured, constructed and arranged, constructed, manufactured and arranged, and the like.

The invention claimed is:

1. An interconnectable circuit board array, comprising:
   a plurality of interconnectable circuit boards, the circuit boards comprising
   a distal end comprising a first electrically conductive pad and a second electrically conductive pad located on a surface of the circuit board;
   a proximal end comprising a third electrically conductive pad and a fourth electrically conductive pad located on the surface of the circuit board;
   a plurality of board to board connectors, the board to board connectors comprising
   a first lateral side conductor to provide electrical communication between the first electrically conductive pad of a first circuit board amongst the plurality of interconnectable circuit boards and the third electrically conductive pad of a second circuit board amongst the plurality of interconnectable circuit boards,
   a second lateral side conductor to provide electrical communication between the second electrically conductive pad of the first circuit board and the fourth electrically conductive pad of the second circuit board; and
   one or more alignment tabs disposed within the gap between the first and second circuit boards, wherein removal of the alignment tab allows for the first circuit board and the second circuit board to be bent with respect to one another in a lateral plane to form an angle;
   wherein the distal end of the first circuit board and the proximal end of the second circuit board define a gap between the first circuit board and the second circuit board, the gap being bridged by the first lateral side conductor and the second lateral side conductor;
   wherein the board to board connectors are configured such that when the first circuit board and the second circuit board are bent in a lateral plane with respect to one another to form an angle, and one of the lateral side conductors is contracted, one of the lateral side conductors is expanded, or one of the lateral side conductors is contracted and the other lateral side conductor is expanded.

2. The interconnectable circuit board array of claim 1, wherein the first lateral side conductor and the second lateral side conductor include a curved portion.

3. The interconnectable circuit board array of claim 2, wherein the curved portions of the first lateral side conductor and the second lateral side conductor are curved in opposite directions from one another.

4. The interconnectable circuit board array of claim 2, wherein the curved portions cause the alignment tabs to be closer to an adjacent lateral edge of the circuit boards than the lateral side conductors.

5. The interconnectable circuit board array of claim 1, wherein the first lateral side conductor and the second lateral side conductor include a zigzag portion.

6. The interconnectable circuit board array of claim 1, wherein the first lateral side conductor and the second lateral side conductor include at least two linear segments.

7. The interconnectable circuit board array of claim 1, wherein the first lateral side conductor and the second lateral side conductor are elastically deformable.

8. The interconnectable circuit board array of claim 1, wherein the lateral side conductors exhibit a spring force when contracted or expanded, wherein the spring force exhibited is in the opposite direction of the contracted or expanded state.

9. The interconnectable circuit board array of claim 1, wherein the first lateral side conductor and the second lateral side conductor remain in the same horizontal plane when expanded or contracted.

10. The interconnectable circuit board array of claim 1, wherein the board to board connectors are configured to allow the first circuit board and the second circuit board to bend in a lateral plane with respect to one another to form an angle of at least about 10 degrees.

11. The interconnectable circuit board array of claim 1, wherein the board to board connectors are configured to allow the first circuit board and the second circuit board to bend in a lateral plane with respect to one another to form an angle of at least about 30 degrees.

12. The interconnectable circuit board array of claim 1, wherein the board to board connectors are configured to allow the first circuit board and the second circuit board to bend in a lateral plane with respect to one another to form an angle of at least about 50 degrees.

13. The interconnectable circuit board array of claim 1, wherein individual circuit boards amongst the plurality of interconnectable circuit boards are configured to bend in a lateral plane with respect to one another sufficiently to form a lateral plane ring.

14. The interconnectable circuit board array of claim 13, wherein the ring has a diameter of less than 36 inches.

15. The interconnectable circuit board array of claim 1, wherein at least one of the first and second circuit boards comprises at least a first circuit board portion and a second circuit board portion that are physically coupled in an overlapping arrangement.

16. The interconnectable circuit board array of claim 1, the board to board connector comprising an electrical insulator connected to the first lateral side conductor and the second lateral side conductor.

17. The interconnectable circuit board array of claim 1, wherein the interconnectable circuit board array is wound around a hub of a reel.

18. An interconnectable circuit board array, comprising:
   a plurality of interconnectable circuit boards, the circuit boards comprising
   a distal end comprising a first electrically conductive pad and a second electrically conductive pad located on a surface of the circuit board;
   a proximal end comprising a third electrically conductive pad and a fourth electrically conductive pad located on the surface of the circuit board;
   a plurality of board to board connectors, the board to board connectors comprising
   a first lateral side conductor to provide electrical communication between the first electrically conductive pad of a first circuit board amongst the plurality of interconnectable circuit boards and the third electrically conductive pad of a second circuit board amongst the plurality of interconnectable circuit boards, and
   a second lateral side conductor to provide electrical communication between the second electrically conductive pad of the first circuit board and the fourth electrically conductive pad of the second circuit board;

wherein the distal end of the first circuit board and the proximal end of the second circuit board define a gap between the first circuit board and the second circuit board, the gap being bridged by the first lateral side conductor and the second lateral side conductor;

wherein the board to board connectors are configured such that when the first circuit board and the second circuit board are bent in a lateral plane with respect to one another to form an angle, and one of the lateral side conductors is contracted, one of the lateral side conductors is expanded, or one of the lateral side conductors is contracted and the other lateral side conductor is expanded;

wherein at least one of the first and second circuit boards comprises at least a first circuit board portion and a second circuit board portion that are physically coupled in an overlapping arrangement.

* * * * *